United States Patent
Matsubara et al.

(10) Patent No.: US 11,749,366 B2
(45) Date of Patent: Sep. 5, 2023

(54) SEMICONDUCTOR MEMORY DEVICE CAPABLE OF PERFORMING SOFT-POST-PACKAGE-REPAIR OPERATION

(71) Applicant: MICRON TECHNOLOGY, INC., Boise, ID (US)

(72) Inventors: Yasushi Matsubara, Isehara (JP); Alan Wilson, Boise, ID (US); Minoru Someya, Chofu (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/578,305

(22) Filed: Jan. 18, 2022

(65) Prior Publication Data

US 2023/0230648 A1    Jul. 20, 2023

(51) Int. Cl.
| | |
|---|---|
| G11C 29/02 | (2006.01) |
| G11C 29/44 | (2006.01) |
| G11C 29/12 | (2006.01) |
| G11C 7/10 | (2006.01) |
| G11C 29/18 | (2006.01) |
| G11C 8/18 | (2006.01) |

(52) U.S. Cl.
CPC .......... *G11C 29/027* (2013.01); *G11C 7/1012* (2013.01); *G11C 8/18* (2013.01); *G11C 29/1201* (2013.01); *G11C 29/12015* (2013.01); *G11C 29/18* (2013.01); *G11C 29/4401* (2013.01)

(58) Field of Classification Search
CPC ....... G11C 29/027; G11C 7/1012; G11C 8/18; G11C 29/1201; G11C 29/12015; G11C 29/18; G11C 29/4401
See application file for complete search history.

(56) References Cited

U.S. PATENT DOCUMENTS

| | | | |
|---|---|---|---|
| 7,952,950 B2* | 5/2011 | Miyatake | G11C 17/18 365/201 |
| 2019/0108893 A1* | 4/2019 | Shim | G11C 29/027 |
| 2020/0327951 A1* | 10/2020 | Jung | G11C 17/16 |

* cited by examiner

*Primary Examiner* — Mohammed A Bashar
(74) *Attorney, Agent, or Firm* — Dorsey & Whitney LLP

(57) ABSTRACT

Disclosed herein is an apparatus that includes a fuse array circuit including a plurality of fuse sets each assigned to a corresponding one of a plurality of fuse addresses and configured to operatively store a fuse data, and a first circuit configured to generate and sequentially update a fuse address to sequentially read the fuse data from the plurality of fuse sets. The first circuit is configured to change a frequency of updating the fuse address based on a first signal.

17 Claims, 16 Drawing Sheets

SEMICONDUCTOR MEMORY DEVICE CAPABLE OF PERFORMING SOFT-POST-PACKAGE-REPAIR OPERATION

BACKGROUND

In a semiconductor memory device such as a DRAM, a defective word line or a defective bit line is replaced with a spare word line or a spare bit line. The address of the defective word line or the defective bit line is stored in a non-volatile memory circuit including a plurality of fuse elements or a plurality of anti-fuse elements. The address stored in the non-volatile memory circuit is read out when the semiconductor memory device is turned on, and is transferred to a volatile address latch circuit. Address writing to the non-volatile memory circuit is performed in a manufacturing stage of the semiconductor memory device. A replacement operation using the non-volatile memory circuit is called "hard post package repair".

Some semiconductor memory devices in recent years are configured to be repairable by soft post package repair, in addition to hard post package repair. Soft post package repair is an operation of issuing a soft-post-package-repair command to write an address directly to a volatile address latch circuit. In a semiconductor memory device that is repairable by soft post package repair, it is desirable to complete soft post package repair in the shortest time possible.

DETAILED DESCRIPTION

Various embodiments of the present disclosure will be explained below in detail with reference to the accompanying drawings. The following detailed description refers to the accompanying drawings that show, by way of illustration, specific aspects, and various embodiments of the present disclosure. The detailed description provides sufficient detail to enable those skilled in the art to practice these embodiments of the present disclosure. Other embodiments may be utilized, and structural, logical, and electrical changes may be made without departing from the scope of the present disclosure. The various embodiments disclosed herein are not necessary mutually exclusive, as some disclosed embodiments can be combined with one or more other disclosed embodiments to form new embodiments.

A semiconductor memory device according to the present disclosure sequentially generates a fuse address by continuously incrementing a counter in a soft-post-package-repair operation, as in Fuse Data Broadcast performed in initialization after power is turned on. The semiconductor memory device then increments the counter at a high speed in a first period before a value of the fuse address reaches a memory bank that is a target of the soft-post-package-repair operation, and increments the counter at a low speed in a second period after the value of the fuse address reaches the target memory bank, thereby shortening a time required for the soft-post-package-repair operation.

Figure 1:
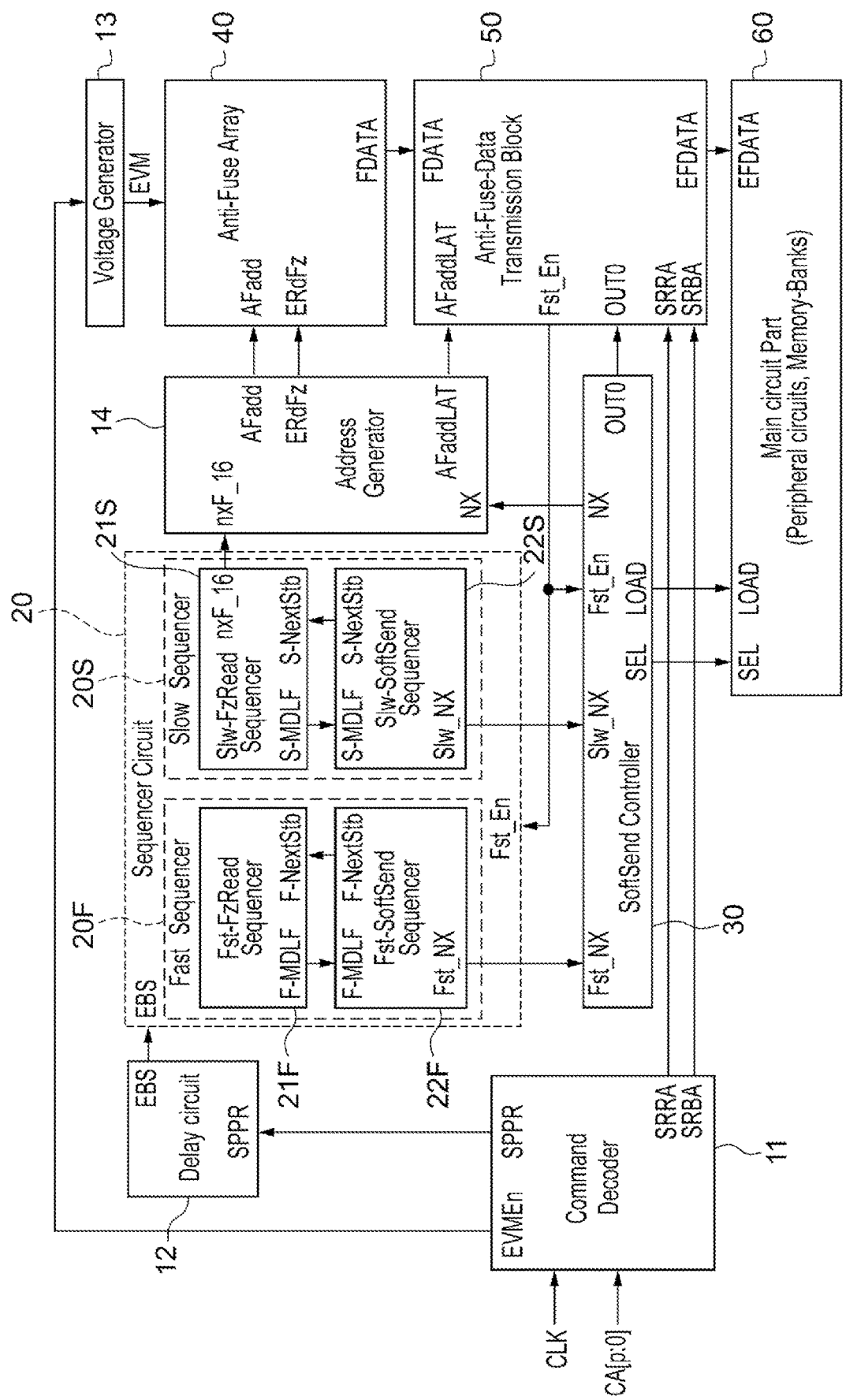
FIG. 1 is a block diagram showing a configuration of a semiconductor memory device according to an embodiment of the present disclosure.
Figure 2:
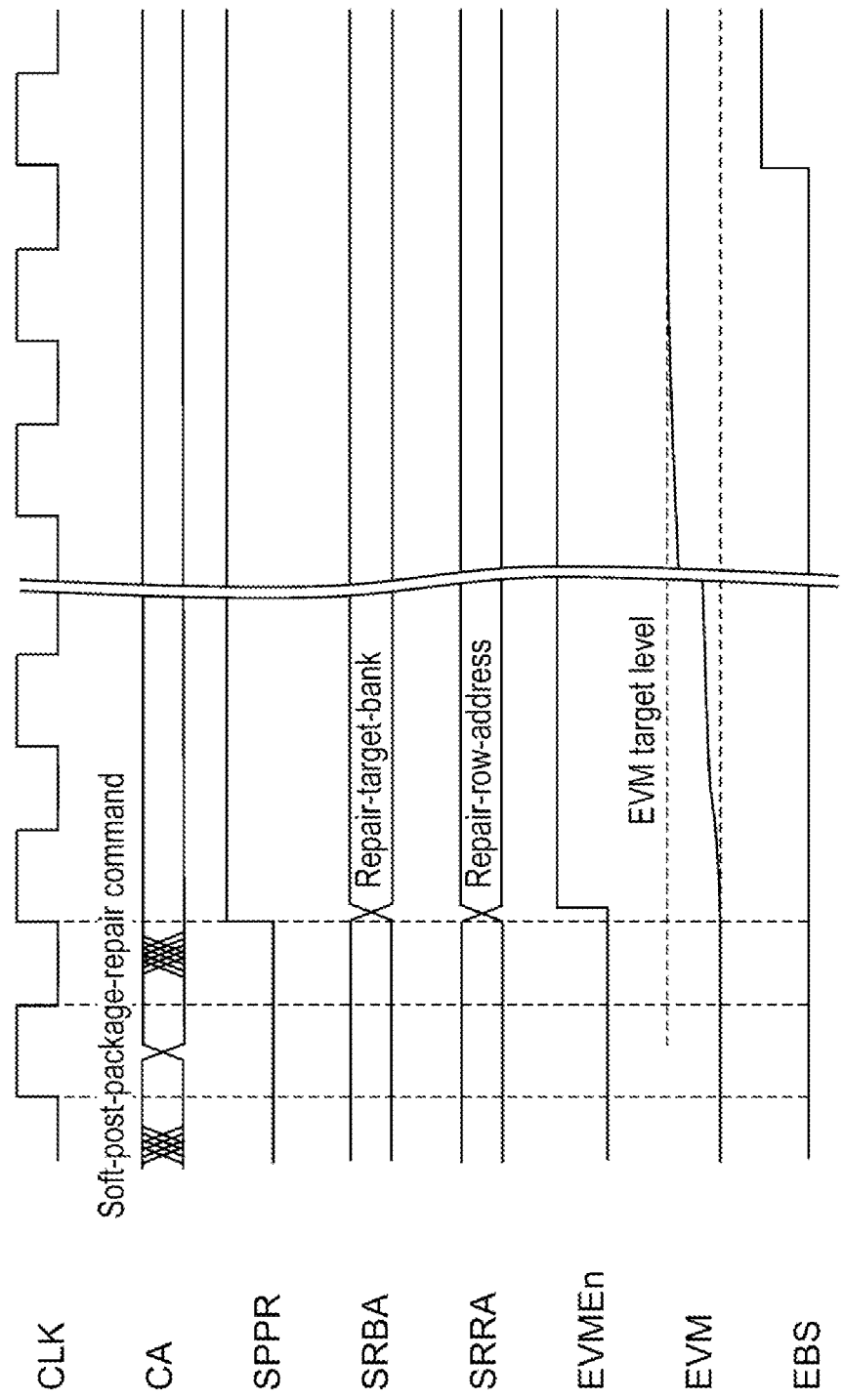
FIG. 2 is a timing chart for explaining operations of a command decoder, a delay circuit, and a power circuit according to an embodiment of the present disclosure.

FIG. 1 is a block diagram showing a configuration of the semiconductor memory device according to the present disclosure. As shown in FIG. 1, the semiconductor memory device according to the present disclosure includes a command decoder 11 that receives a command address signal CA and a clock signal CLK. The command address signal CA is supplied from an external controller. The clock signal CLK is generated in the semiconductor memory device based on an external clock signal. In a case where the command address signal CA input in synchronization with the clock signal CLK indicates a soft-post-package-repair command as shown in FIG. 2, the command decoder 11 activates a soft-post-package-repair signal SPPR and an enable signal EVMEn. The soft-post-package-repair signal SPPR is supplied to a delay circuit 12, and the enable signal EVMEn is supplied to a voltage generator 13. A repair bank address SRBA and a repair row address SRRA included in the command address signal CA are supplied to an anti-fuse-data transmission block 50.

When the soft-post-package-repair signal SPPR is activated, the delay circuit 12 activates a start signal EBS after a predetermined delay time. When the enable signal EVMEn is activated, the voltage generator 13 raises an internal power supply EVM to be supplied to an anti-fuse array 40 to a predetermined level. As shown in FIG. 2, a predetertmined time is required from activation of the enable signal EVMEn until the internal power supply EVM reaches the predetertmined level. After the internal power supply EVM teaches the predetermined level, the delay circuit 12 activates the start signal EBS. The start signal EBS is supplied to a sequencer circuit 20. The sequencer circuit 20 controls operation timings in a soft-post-package-repair operation.

Figure 3:
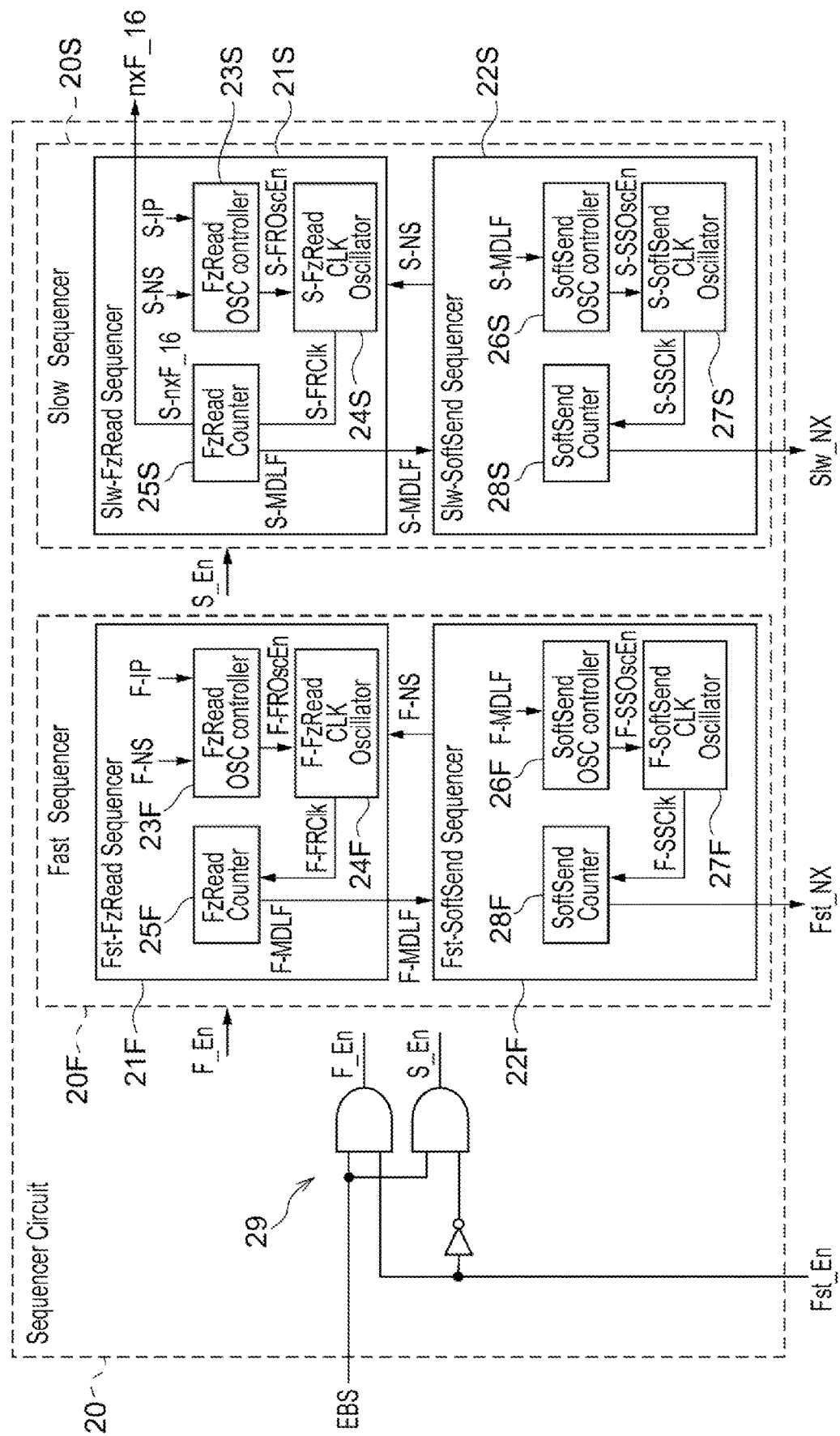
FIG. 3 is a block diagram showing a circuit configuration of a sequencer circuit according to an embodiment of the present disclosure.

FIG. 3 is a block diagram showing a circuit configuration of the sequencer circuit 20. As shown in FIG. 3, the sequencer circuit 20 includes a fast sequencer 20F and a slow sequencer 20S. The fast sequencer 20F is used in a first period in which fuse address update in a soft-post-package-repair operation is performed at a high speed. The first period is a period in which a fuse address supplied to the anti-fuse anrray 40 and the anti-fuse-data transmission block 50 is outside the range of a target repair bank address SRBA in the soft-post-package-repair operation. Meanwhile, the slow sequencer 20S is used in a second period in which the fuse address update in the soft-post-package-repair operation is performed at a low speed. The second period is a period in which the fuse address supplied to the anti-fuse array 40 and the anti-fuse-data transmission block 50 is in the range of the target repair bank address SRBA of the soft-post-package-repair operation. The slow sequencer 20S is used also in Fuse Data Broadcast performed in initialization after power-on. The fast sequencer 20F is activated based on an enable signal F_En generated by a gate circuit 29. The slow sequencer 20S is activated based on an enable signal S_En generated by the gate circuit 29. The gate circuit 29 activates either the enable signal F_En or the enable signal S_En based on a speed selection signal Fst_En when the start signal EBS is activated. The speed selection signal Fst_En is a signal for selecting whether to cause the sequencer circuit 20 to operate at a high speed or at a low speed and is generated by the anti-fuse-data transmission block 50.

The fast sequencer 20F includes a fuse read sequencer 21F and a soft send sequencer 22F. The fuse read sequencer 21F includes an oscillator control circuit 23F that generates an enable signal F-FROscEn based on an initial pulse F-IP and a next strobe signal F-NS, an oscillator circuit 24F that generates a clock signal F-FRClk based on the enable signal F-FROscEn, and a counter circuit 25F that counts the clock signal F-FRClk to generate a timing signal F-MDLF. The soft send sequencer 22F includes an oscillator control circuit 26F that generates an enable signal F-SSOscEn based on the timing signal F-MDLF, an oscillator circuit 27F that generates a clock signal F-SSClk in response to the enable signal F-SSOscEn, and a counter circuit 28F that counts the clock signal F-SSClk to generate a count value Fst_NX. The frequency of the clock signal F-FRClk and the frequency of the clock signal F-SSClk may be the same as each other.

The slow sequencer 20S includes a fuse read sequencer 21S and a soft send sequencer 22S. The fuse read sequencer 21S includes an oscillator control circuit 23S that generates an enable signal S-FROscEn based on an initial pulse S-IP and a next strobe signal S-NS, an oscillator circuit 24S that generates a clock signal S-FRClk in response to the enable signal S-FROscEn, and a counter circuit 25S that counts the clock signal S-FRClk to generate timing signals S-MDLF and nxF_16. The soft send sequencer 22S includes an oscillator control circuit 26S that generates an enable signal S-SSOscEn based on the timing signal S-MDLF, an oscillator circuit 27S that generates a clock signal S-SSClk in response to the enable signal S-SSOscEn, and a counter circuit 28S that counts the clock signal S-SSClk to generate a count value Slw_NX. The frequency of the clock signal S-FRClk is lower than the frequency of the clock signal F-FRClk. Similarly, the fiequency of the clock signal S-SSClk is lower than the frequency of the clock signal F-SSClk. The frequency of the clock signal S-FRClk and the frequency of the clock signal S-SSClk may be the same as each other. The count values Fst_NX and Slw_NX are supplied to a soft send controller 30. The timing signal nxF_16 is supplied to an address generation circuit 14. The operation of the sequencer circuit 20 will be described later.

Figure 4:
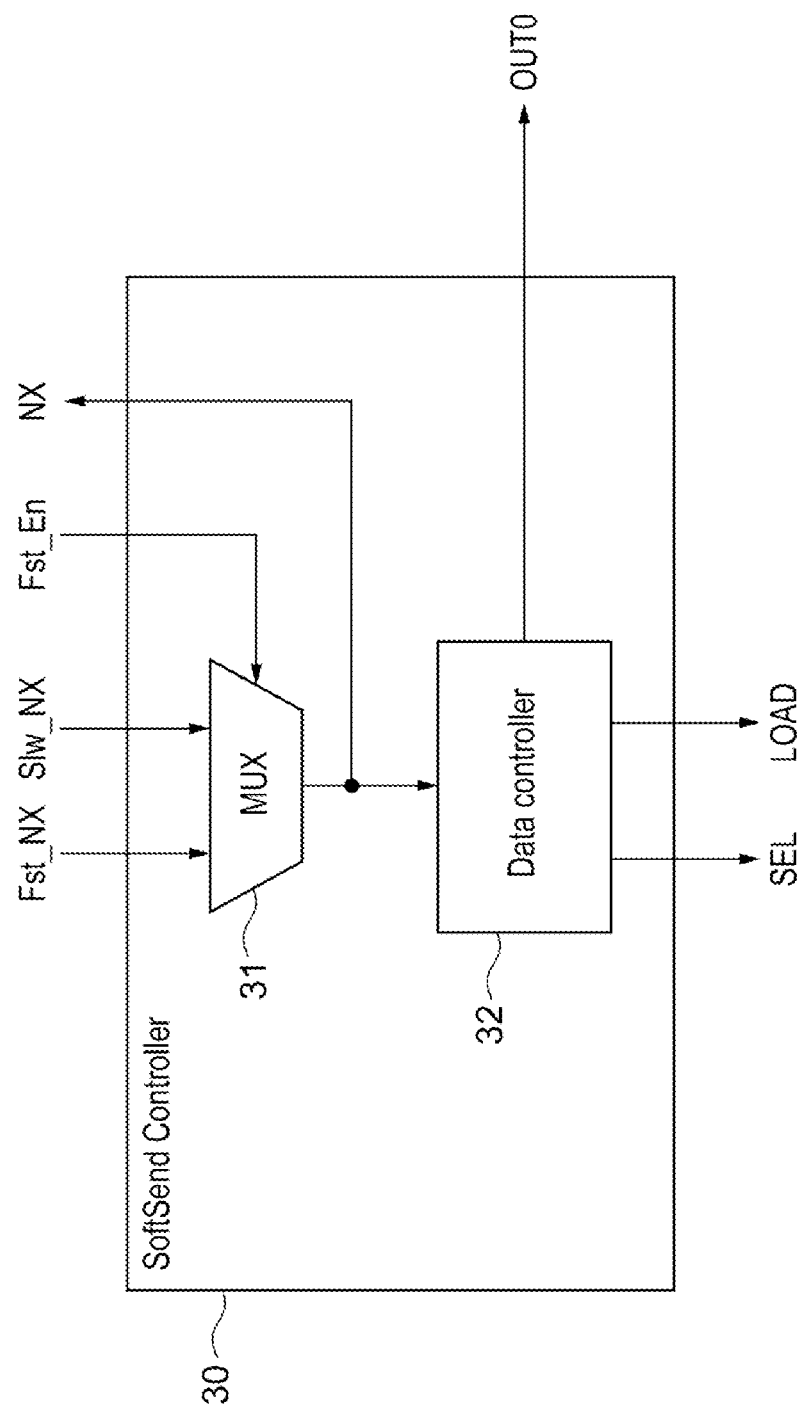
FIG. 4 is a block diagram showing a circuit configuration of a soft send controller according to an embodiment of the present disclosure.

FIG. 4 is a block diagram showing a circuit configuration of the soft send controller 30. As shown in FIG. 4, the soft send controller 30 includes a multiplexer 31 that selects one of the count values Fst_NX and Slw_NX based on the speed selection signal Fst_En and a data controller 32 that generates a timing signal OUT0, a selection signal SEL, and a load signal LOAD based on a count value NX output from the multiplexer 31. The count value NX is supplied to the address generation circuit 14. The timing signal OUT0 is supplied to the anti-fuse-data transmission block 50. The selection signal SEL and the load signal LOAD are supplied to a main circuit part 60 including memory banks and peripheral circuits. The address generation circuit 14 generates fuse addresses AFadd and AFaddLAT and a fuse read signal ERdFz based on the count value NX and the timing signal nxF_16. The fuse address AFadd and the fuse read signal ERdFz are supplied to the anti-fuse array circuit 40.

Figure 5:
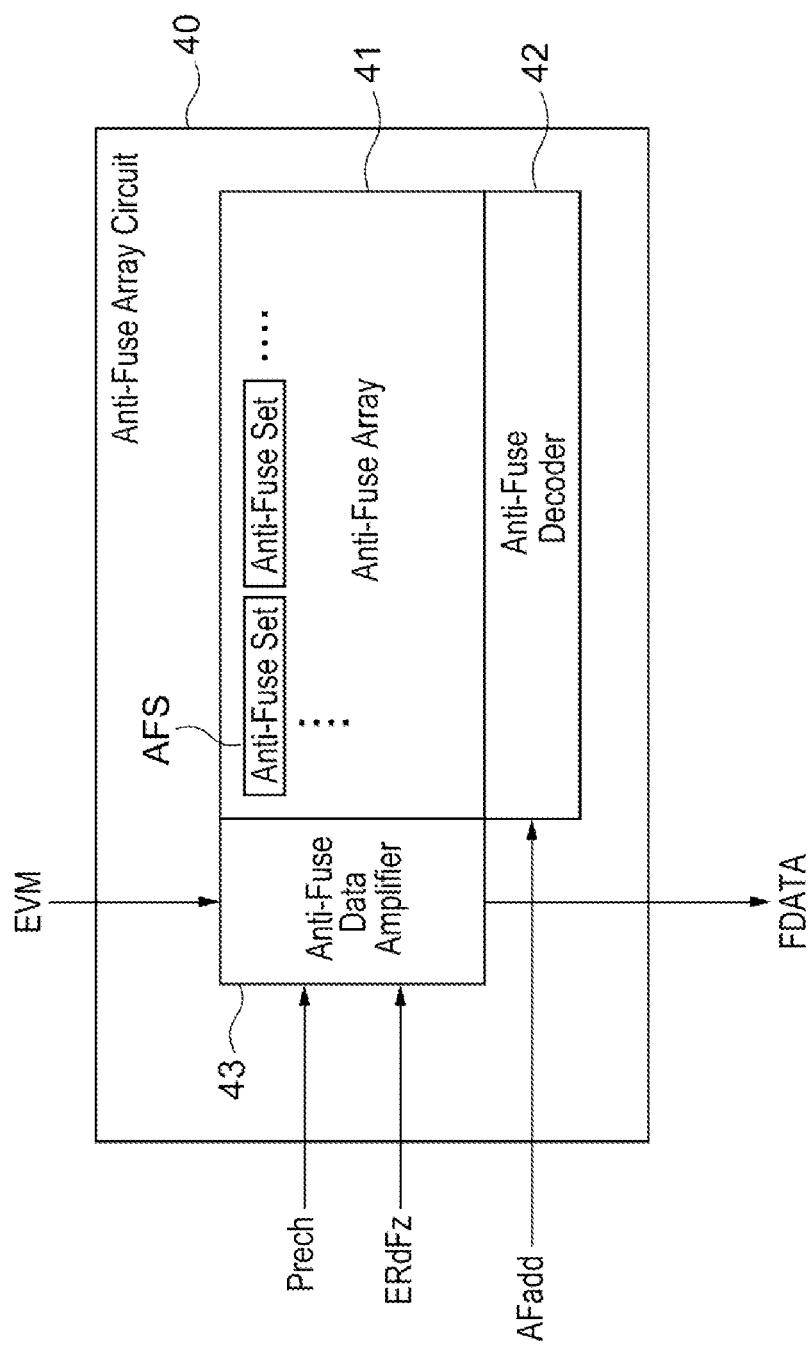
FIG. 5 is a block diagram showing a circuit configuration of an anti-fuse array circuit according to an embodiment of the present disclosure.

FIG. 5 is a block diagram showing a circuit configuration of the anti-fuse array circuit 40. As shown in FIG. 5, the anti-fuse array circuit 40 includes an anti-fuse array 41 including a plurality of anti-fuse sets AFS, an anti-fuse decoder 42 that selects any of the anti-fuse sets AFS based on the fuse address AFadd, and an anti-fuse-data amplification circuit 43 that amplifies an anti-fuse data FDATA written in the selected anti-fuse setAFS. Fach anti-fuse set AFS includes a plurality of anti-fuse elements. The anti-fuse set AFS may use another type of non-volatile memory elements instead of the anti-fuse elements. The anti-fuse sets AFS are each assigned to a spare word line. A plurality of the spare word lines are prepared for one memory bank. The anti-fuse array circuit 40 may include an anti-fuse set AFS corresponding to a spare bit line. The anti-fuse sets AFS assigned to the same memory bank form a group. The anti-fuse-data amplification circuit 43 operates by the internal power supply EVM supplied from the voltage generator 13 and amplifies the anti-fuse data FDATA in a period in which the fuse read signal ERdFz is activated. The anti-fuse data FDATA output from the anti-fuse-data amplification circuit 43 is supplied to the anti-fuse-data transmission block 50.

Figure 6:
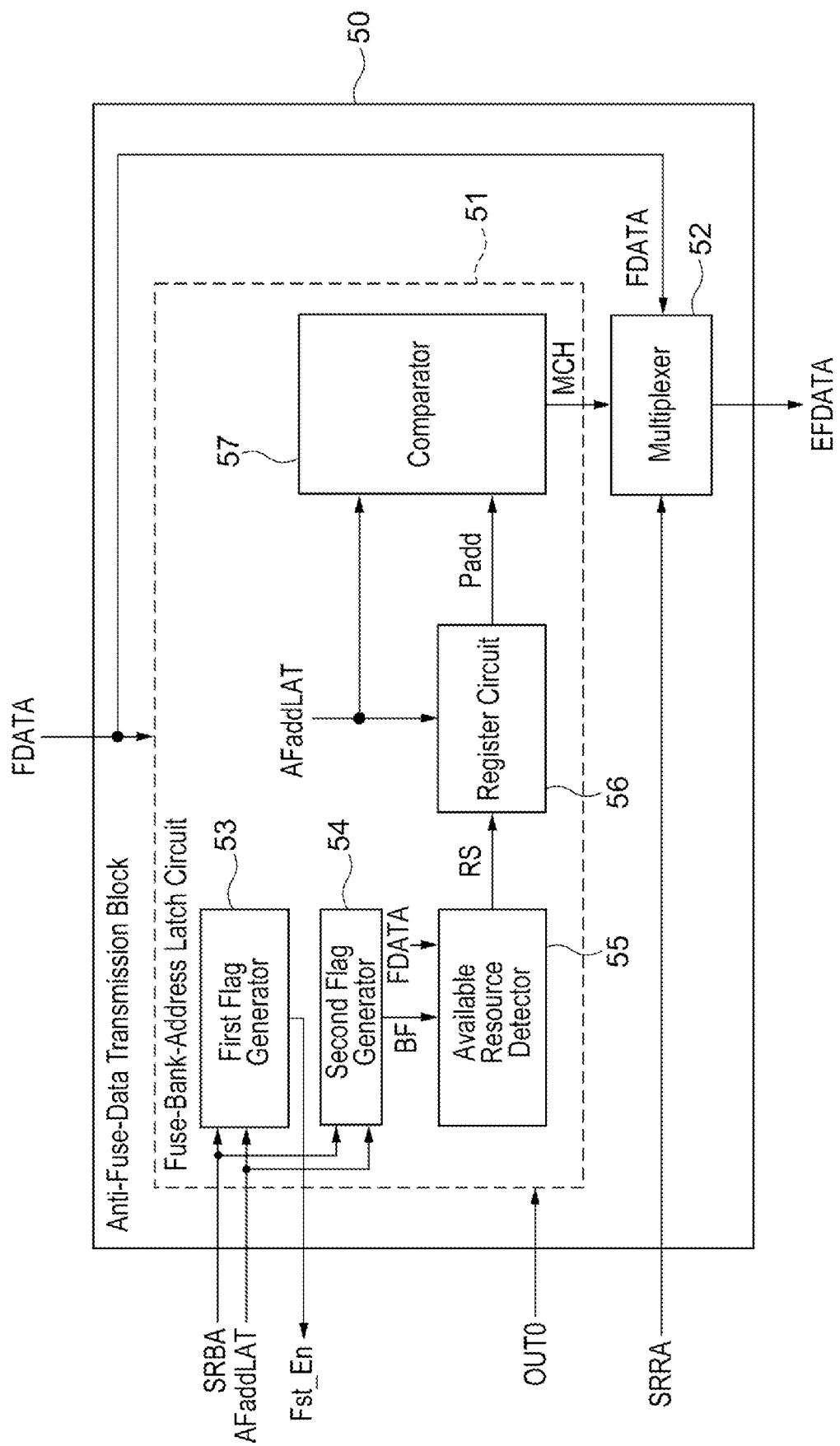
FIG. 6 is a block diagram showing a circuit configuration of an anti-fuse-data transmission block according to an embodiment of the present disclosure.

FIG. 6 is a block diagram showing a circuit configuration of the anti-fuse-data transmission block 50. As shown in FIG. 6, the anti-fuse-data transmission block 50 includes a fuse-bank-address latch circuit 51 and a multiplexer 52. The fuse-bank-address latch circuit 51 includes flag generation circuits 53 and 54 that receive the repair bank address SRBA and the fuse address AFaddLAT, an available resource detector 55, a register circuit 56, and a comparator 57. The flag generation circuits 53 and 54 compare the repair bank address SRBA and the fuse address AFaddLAT with each other to deactivate the speed selection signal Fst_En and activate a bank flag BF when the fuse address AFaddLAT is in the range of the repair bank address SRBA. That is, when the anti-fuse set AFS corresponding to the current fuse address AFaddLAT is in a group corresponding to a memory bank that is a target of a soft-post-package-repair operation, the speed selection signal Fst_En is deactivated and the bank flag BF is activated. Although the speed selection signal Fst_En and the bank flag BF are linked with each other, timings thereof are adjusted in such a manner that the speed selection signal Fst_En is deactivated short before the bank flag BF is activated, as described later. The available resource detector 55 analyzes the anti-fuse data FDATA to determine whether the anti-fuse set AFS corresponding thereto is being used or is unused. When the bank flag BF has been activated and it has been determined that the anti-fuse set AFS corresponding to the anti-fuse data FDATA is unused, the available resource detector 55 activates a strobe signal RS. The register circuit 56 latches the fuse address AFaddLAT in response to the strobe signal RS. Accordingly, the fuse address of the anti-fuse set AFS that corresponds to the repair bank address SRBA and is unused is latched in the register circuit 56. The comparator 57 compares a fuse address Padd latched in the register circuit 56 and the fuse address AFaddLAT output from the address generation circuit 14 with each other and activates a match signal MCH when both of the addresses match with each other. The match signal MCH is supplied to the multiplexer 52. The multiplexer 52 outputs the anti-fuse data FDATA as a fuse data EFDATA when the match signal MCH is inactive, and outputs the repair row address SRRA as the fuse data EFDATA instead of the anti-fuse data FDATA when the match signal MCH is active. Accordingly, the anti-fuse data FDATA is replaced with the repair row address SRRA at a timing of activation of the match signal MCH. The fuse data EFDATA is supplied to the main circuit part 60 including memory banks and peripheral circuits.

Figure 7:
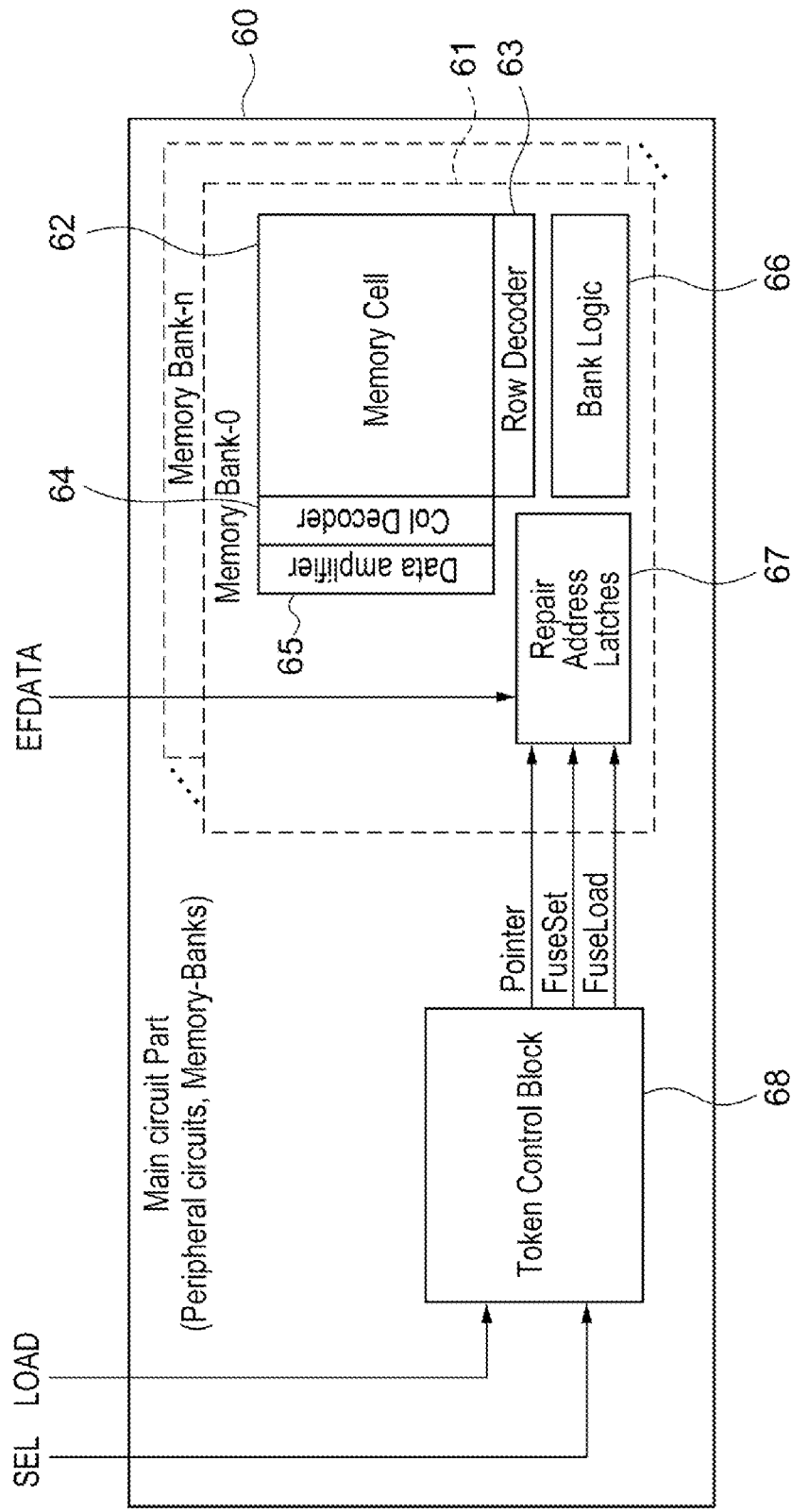
FIG. 7 is a block diagram showing a circuit configuration of a main circuit part according to an embodiment of the present disclosure.

FIG. 7 is a block diagram showing a circuit configuration of the main circuit part 60. As shown in FIG. 7, the main circuit part 60 includes a plurality of memory banks 61. In the example shown in FIG. 7, the main circuit part 60 includes n+1 memory banks 61. Each memory bank 61 includes a memory cell anrray 62 including a plurality of memory cells, a row decoder 63 that performs row access to the memory cell array 62, a column decoder 64 that performs column access to the memory cell anrray 62, a data amplifier 65 that amplifies a data read out from the memory cell array 62, a bank logic 66 that controls the operation of the entire memory bank, and a repair-address latch circuit 67 that stores therein the address of a defective word line. The fuse data EFDATA is supplied to the repair-address latch circuit 67 from the anti-fuse-data transmission block 50. The operation of the repair-address latch circuit 67 is controlled by a pointer signal P, a fuse set signal FS, and a fuse load signal FL output from a token control block 68. The token control block 68 controls timings of the pointer signal P, the fuse set signal FS, and the fuse load signal FL based on the selection signal SEL and the load signal LOAD supplied from the soft send controller 30.

When the semiconductor memory device according to the present disclosure is timed on, an initialization operation is performed. The initialization operation includes Fuse Data Broadcast. The Fuse Data Broadcast is an operation of performing hard post package repair by transferring a plurality of pieces of fuse data FDATA stored in the anti-fuse array 40 to the repair-address latch circuit 67 in the corresponding memory bank 61.

Figure 8:
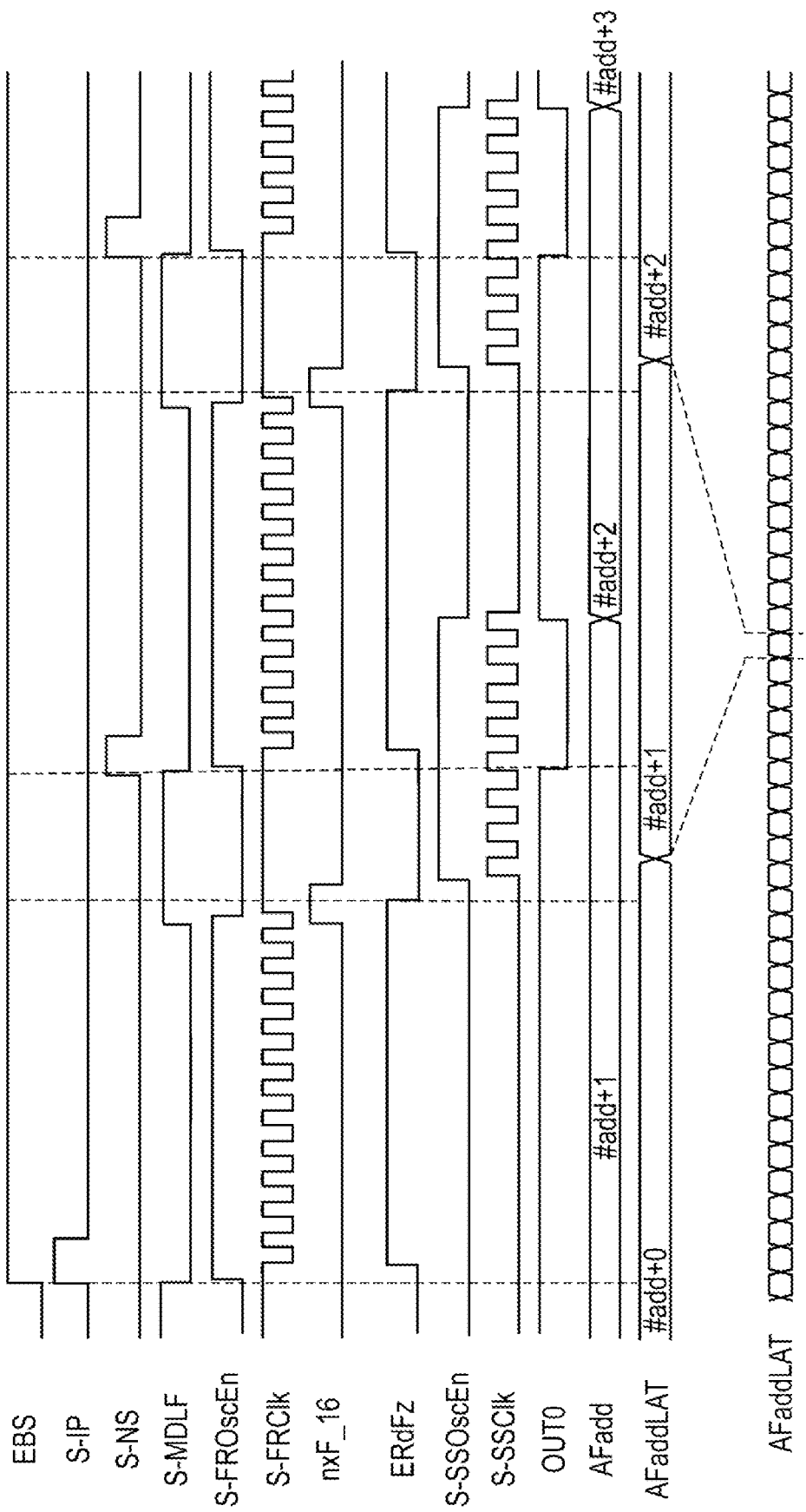
FIG. 8 is a timing chart for explaining Fuse Data Broadcast according to an embodiment of the present disclosure.

FIG. 8 is a timing chart for explaining Fuse Data Broadcast. In a period in which the Fuse Data Broadcast is performed, the speed selection signal Fst_En is deactivated, whereby the slow sequencer 20S is selected in the sequencer circuit 20. During the Fuse Data Broadcast, the fuse address AFaddLAT is updated in a predetermined cycle as shown in FIG. 8. First, when the start signal EBS is activated, the initial pulse S-IP is activated. In response to this activation, the timing signal S-MDLF is changed to a low level and the fuse read signal ERdFz is changed to a high level. When the fuse read signal ERdFz is activated to be high, the anti-fuse anrray 40 performs a read operation for the anti-fuse set AFS specified by the fuse address AFadd and outputs the read anti-fuse data FDATA to the anti-fuse-data transmission block 50. Further, the oscillator control circuit 23S activates the enable signal S-FROscEn in response to the initial pulse S-IP. When the enable signal S-FROscEn is activated, the oscillator circuit 24S starts clocking of the clock signal S-FRClk. The clock signal S-FRClk is counted by the counter circuit 25S. When the count value reaches a predetermined value, the timing signal S-MDLF is changed to a high level and the timing signal nxF_16 is activated. When the timing signal nxF_16 is activated, the address generation circuit 14 deactivates the fuse read signal ERdFz to a low level and updates the fuse address AFaddLAT. Further, when the timing signal S-MDLF is changed to a high level, the oscillator control circuit 26S activates the enable signal S-SSOscEn. When the enable signal S-SSOscEn is activated, the oscillator circuit 27S starts clocking of the clock signal S-SSClk. The clock signal S-SSClk is counted by the counter circuit 28S. When the count value Slw_NX reaches a first count value, the soft send sequencer 22S activates the next strobe signal S-NS. In response to this activation, the timing signal S-MDLF is changed to a low level again and the fuse read signal ERdFz is changed to a high level again. The count value Slw_NX is supplied to the address generation circuit 14 via the multiplexer 31. When the count value Slw_NX reaches the first count value, the fuse read signal ERdFz is activated to a high level. When the count value Slw_NX reaches a second count value, the fuse address AFadd is updated. Accordingly, a read operation for the next anti-fuse set AFS is performed. Furthermore, the soft send controller 30 changes the timing signal OUT0 to a low level when the count value Slw_NX reaches the first count value, and changes the timing signal OUT0 to a high level when the count value Slw_NX reaches the second count value.

By repeating the operation described above, the read operation is performed for all the anti-fuse sets AFS included in the anti-fuse array 40. The read anti-fuse data FDATA is sequentially transferred to the repair-address latch circuit 67 in the memory bank 61 via the anti-fuse-data transmission block 50. The repair-address latch circuit 67 causes a predetermined latch circuit in the repair-address latch circuit 67 to latch the sequentially transferred fuse data EFDATA in response to the pointer signal P, the fuse set signal FS, and the fuse load signal FL output from the token control block 68. The address of a defective word line is latched in the repair-address latch circuit 67 in this manner, whereby hard post package repair is completed. When access to the defective word line is requested, access is made to a spare word line instead of the defective word line.

Figure 9:
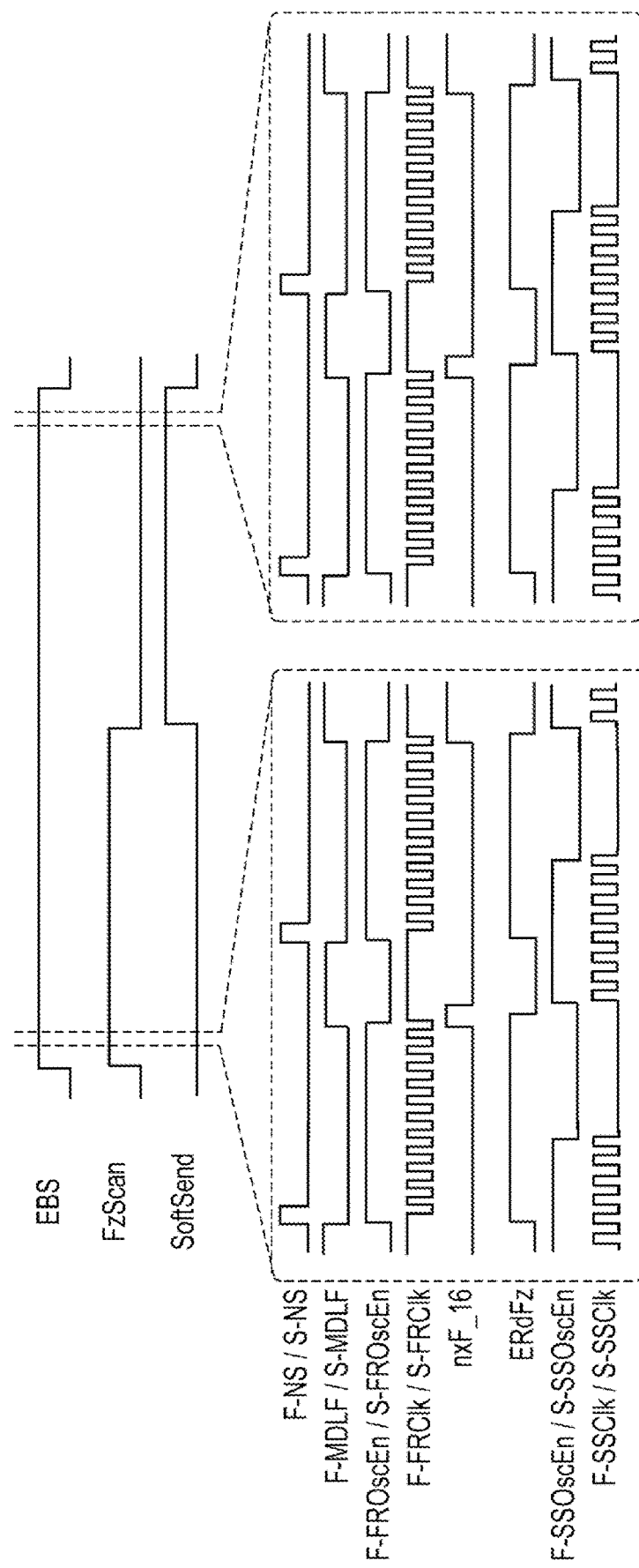
FIG. 9 is a timing chart for explaining an overview of a soft-post-package-repair operation according to an embodiment of the present disclosure.
Figure 10:
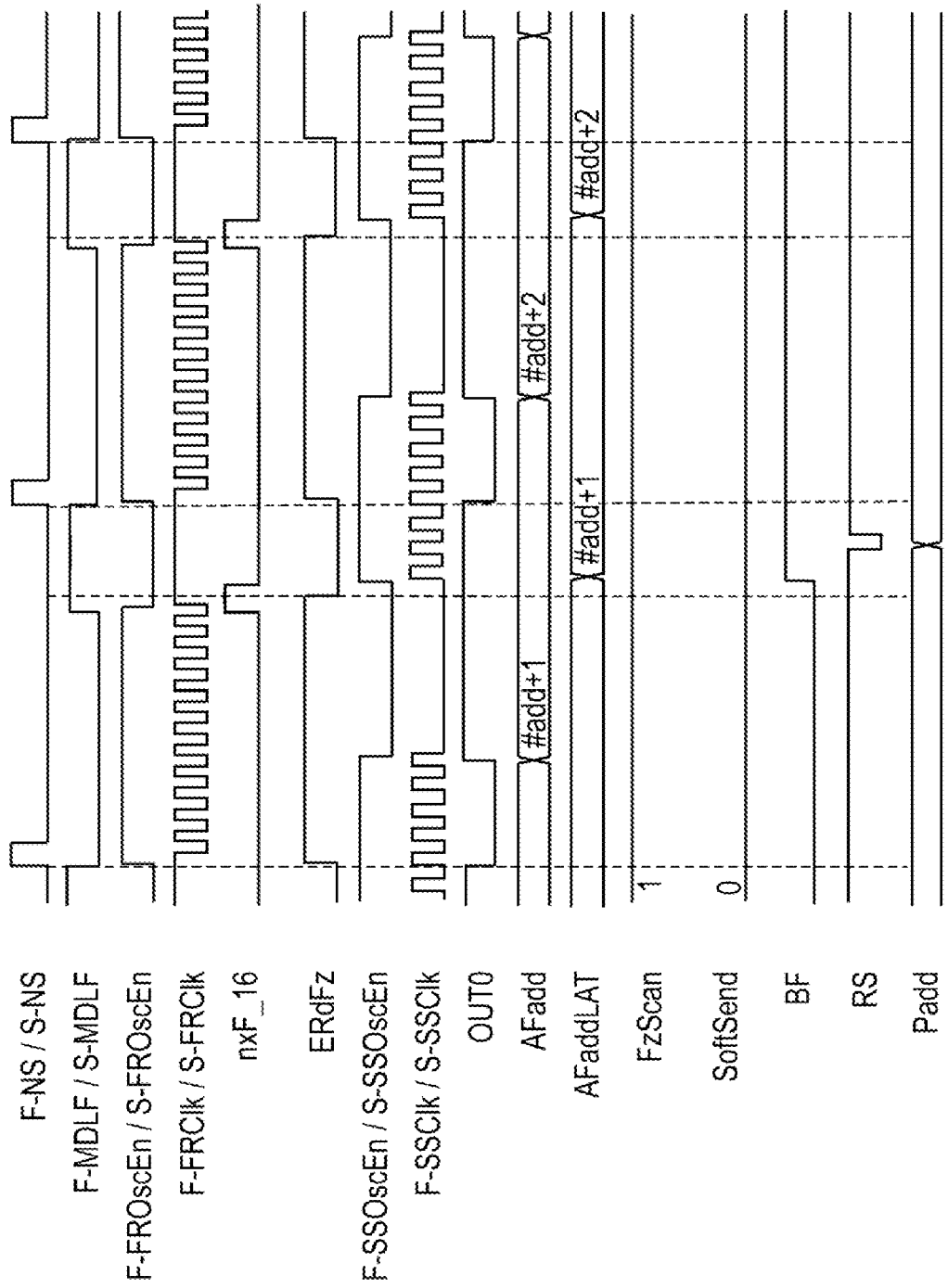
FIG. 10 is a timing chart for explaining a fuse read operation according to an embodiment of the present disclosure.
Figure 11:
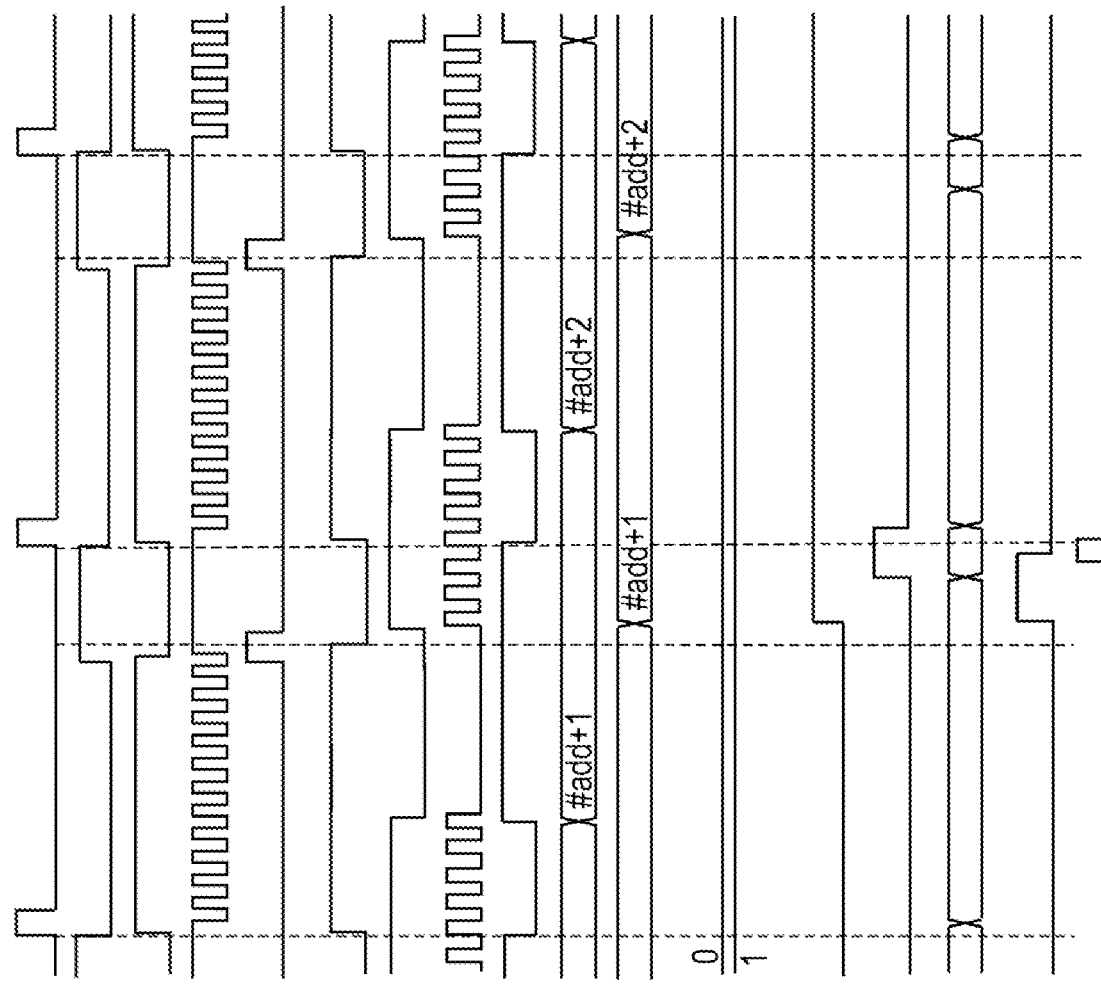
FIG. 11 is a timing chart for explaining a soft send operation according to an embodiment of the present disclosure.

FIG. 9 is a timing chart for explaining an overview of a soft-post-package-repair operation. In the soft-post-package-repair operation, an operation identical to the Fuse Data Broadcast described above is performed twice. In the first round, a fuse scan signal FzScan is activated to a high level. In the second round, a soft send signal SoftSend is activated to a high level. The first round is a "fuse read operation" performed for detecting the fuse address AFadd of the unused anti-fuse set AFS included in the anti-fuse array 40. The second round is a "soft send operation" performed for supplying the repair row address SRRA at a timing at which the unused anti-fuse set AFS is selected. As shown in FIG. 9, the order of change of signals in the fuse read operation and the order of change of signals in the soft send operation are the same as each other. In the fuse read operation performed as the first round, the strobe signal RS is activated in a case where the anti-fuse set AFS corresponding to the anti-fuse data FDATA has been determined to be unused in a state where the bank flag BF is active, as shown in FIG. 10. In response to this activation, the current fuse address AFaddLAT is latched in the register circuit 56. In the soft send operation performed as the second round, the match signal MCH output from the comparator 57 is activated in a case where the fuse address Padd latched in the register circuit 56 and the fuse address AFaddLAT match with each other, as shown in FIG. 11. In response to this activation, the multiplexer 52 outputs the repair row address SRRA as the fuse data EFDATA instead of the read anti-fuse data FDATA.

Figure 12:
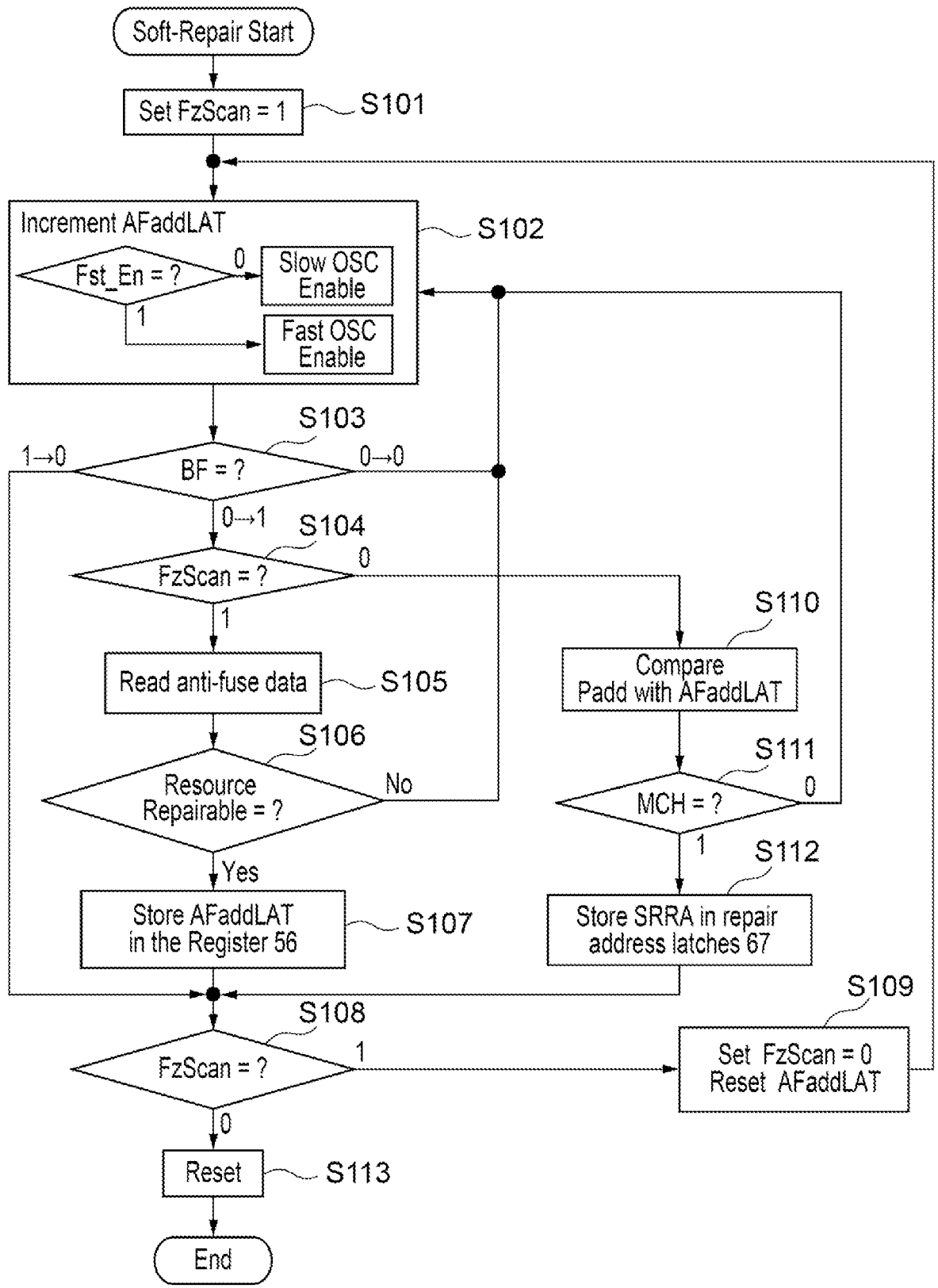
FIG. 12 is a flowchart for explaining a flow of a soft-post-package-repair operation according to an embodiment of the present disclosure.
Figure 13:
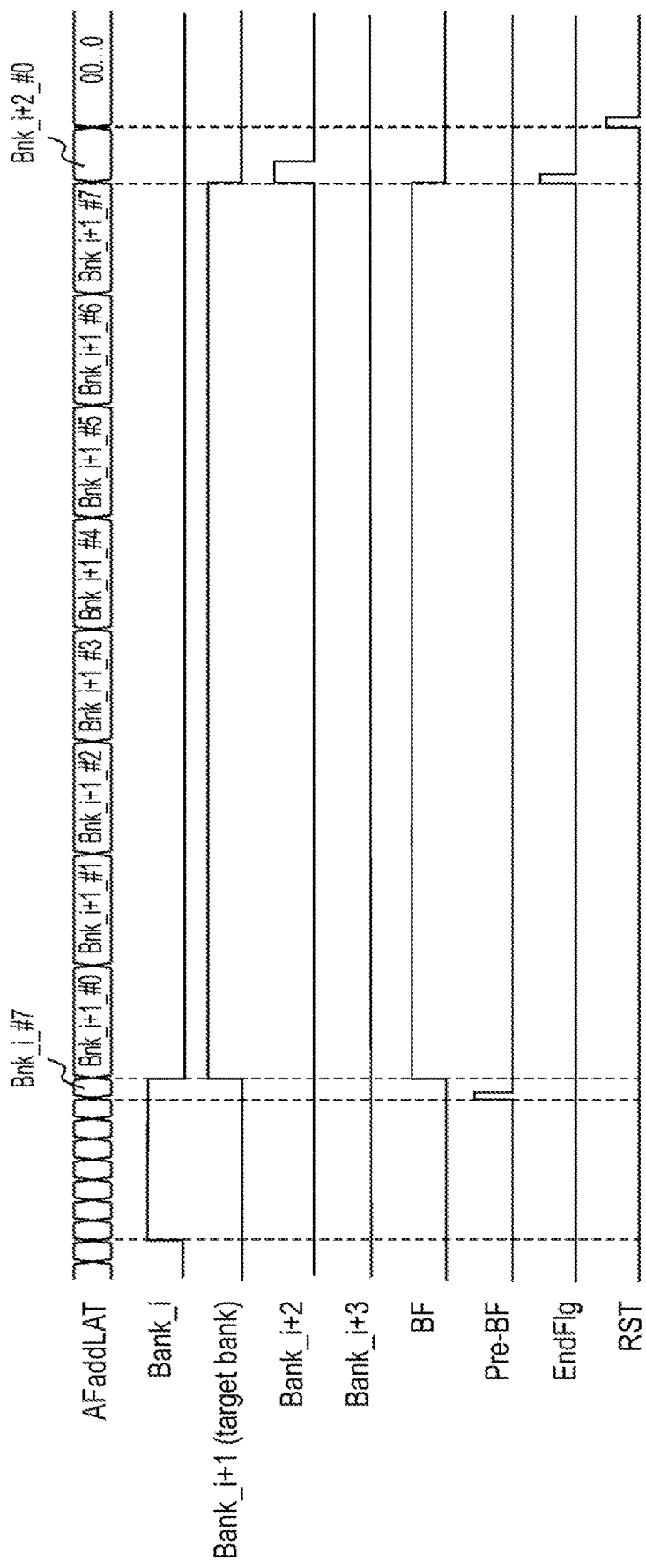
FIG. 13 is a timing chart for explaining changes in the frequency of updating a fuse address in the fuse read operation according to an embodiment of the present disclosure.

FIG. 12 is a flowchart for explaining a flow of a soft-post-package-repair operation. First, when a soft-post-package-repair command is issued from an external controller together with the bank address SRBA and the repair row address SRRA, the fuse scan signal FzScan is activated to a high level (Step S101). Accordingly, a fuse read operation as the first round is started. Next, an operation identical to Fuse Data Broadcast shown in FIG. 8 is performed, whereby the fuse addresses AFadd and AFaddLAT are incremented (Step S102). At this time, when the speed selection signal Fst_En output from the flag generation circuit 53 is high, the fast sequencer 20F is selected. When the speed selection signal Fst_En is low, the slow sequencer 20S is selected. The speed selection signal Fst_En is activated in a case where the fuse address AFaddLAT is in a range of the repair bank address SRBA, as described above. Therefore, in the fuse read operation, the fast sequencer 20F is selected in a period in which the fuse address AFaddLAT is out of the range of the repair bank address SRBA, whereby the fuse read operation is performed at a high speed. On the other hand, in a period in which the fuse address AFaddLAT is in the range of the repair bank address SRBA, the slow sequencer 20S is selected, whereby the fuse read operation is performed at a low speed. The high-speed fuse read operation using the fast sequencer 20F is performed for the purpose of incrementing the fuse address AFaddLAT at a high speed. In this operation, it is permissible that the correct fuse data FDATA is not output from the anti-fuse anay 40. The operation of incrementing the fuse address AFaddLAT is repeated so long as the bank flag BF is low (Step S103). Assuming that the repair bank address SRBA indicates Bank_i+1, the fast sequencer 20F is selected and the fuse address AFaddLAT is incremented at a high speed in a period before the fuse address AFaddLAT reaches Bank_i+1, as shown in FIG. 13. Meanwhile, the low-speed fuse read operation using the slow sequencer 20S is performed for correctly reading out the fuse data FDATA from the anti-fuse set AFS.

Figure 14:
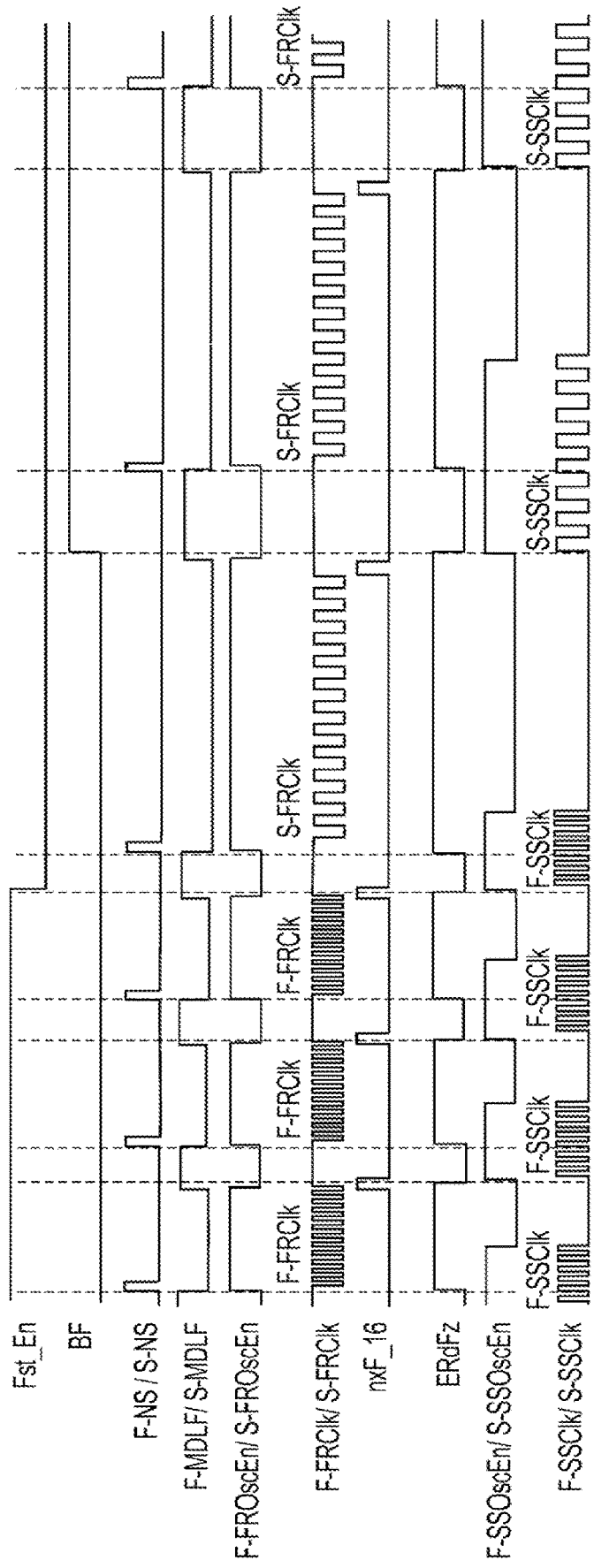
FIG. 14 is a timing chart for explaining an operation of the sequencer circuit before and after switching from a high-speed operation to a low-speed operation according to an embodiment of the present disclosure.
Figure 15:
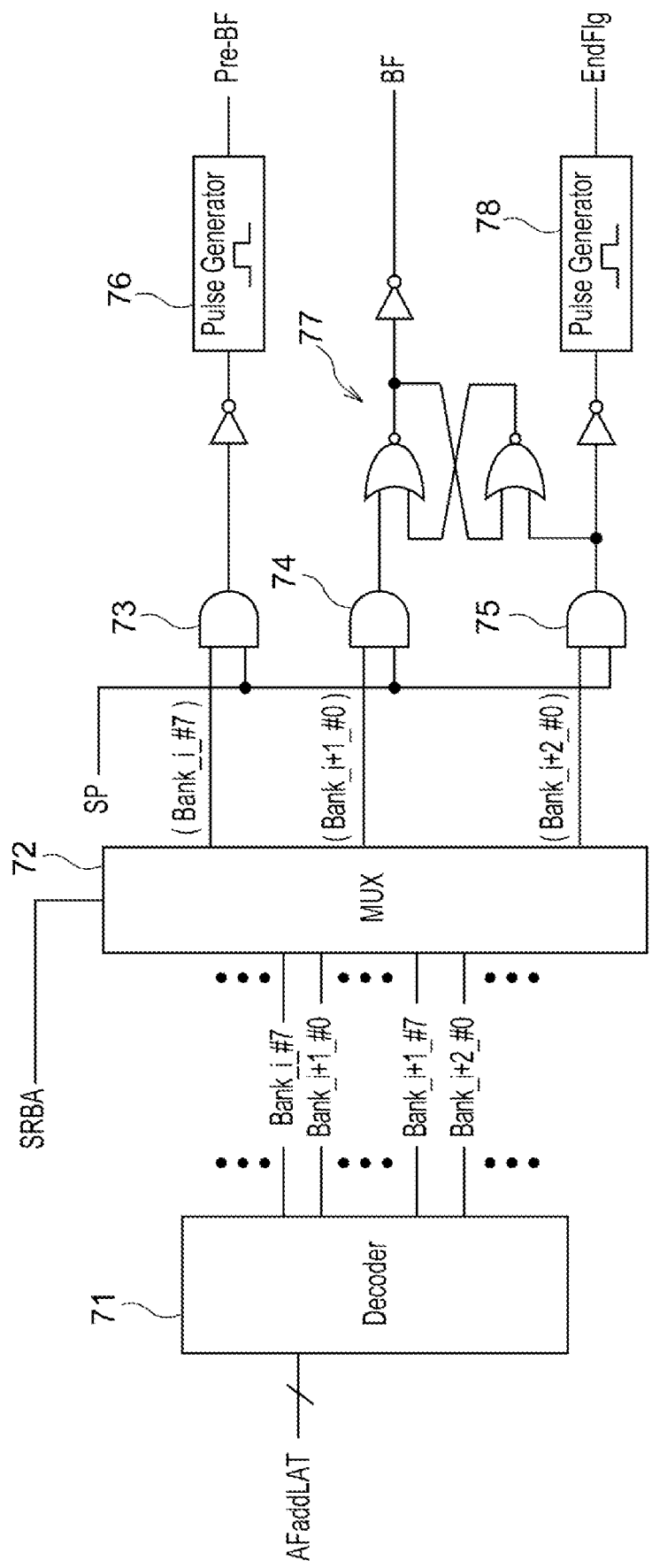
FIG. 15 is a circuit diagram of a circuit for generating a bank flag and a pre-bank flag according to an embodiment of the present disclosure.

As shown in FIG. 13, when the fuse address AFaddLAT reaches Bank_i+1 that is a target, the bank flag BF is changed from a low level to a high level. In conjunction with this change, the speed selection signal Fst_En output from the flag generation circuit 53 is changed to a low level, and the high-speed fuse read operation is switched to the low-speed fuse read operation using the slow sequencer 20S. Accordingly, as shown in FIG. 14, the low-speed clock signals S-FRClk and S-SSClk are used instead of the high-speed clock signals F-FRClk and F-SSClk, and the change timing of each signal generated based on these clock signals is also delayed. The timings of the speed selection signal Fst_En are adjusted in such a manner that this signal is changed to a low level just before the bank flag BF is changed to a high level. In order to achieve this change, a pre-bank flag Pre-BF is generated to be activated just before the bank flag BF is changed to a high level, and the speed selection signal Fst_En is changed to a low level at the timing of activation of the pre-bank flag Pre-BF. FIG. 15 is a circuit diagram of a circuit for generating the bank flag BF and the pre-bank flag Pre-BF. In the example shown in FIG. 15, the repair bank address SRBA indicates Bank_i+1, and eight anti-fuse sets AFS are assigned to one bank. The fuse address AFaddLAT is decoded by a decoder 71. The decoding result is input to a multiplexer 72. The multiplexer 72 outputs the last fuse address Bank_i_#7 in a memory bank Bank_i that is immediately before a target memory bank Bank_i+1, the first fuse address Bank_i+1_#0 in the target memory bank Bank_i+1, and the first fuse address Bank_i+2#0 in a memory bank Bank_i+2 that is immediately after the target memory bank Bank_i+1 based on the repair bank address SRBA. These addresses are respectively supplied to AND gate circuits 73 to 75 that receive a set pulse SP. An output signal of the AND gate circuit 73 is input to a pulse generator 76 to activate the pie-bank flag Pre-BF. An output signal of the AND gate circuit 74 sets an SR larch circuit 77 to activate the bank flag BF. An output signal of the AND gate circuit 75 resets the SR latch circuit 77 to deactivate the bank flag BF. Further, the output signal of the AND gate circuit 75 is input to a pulse generator 78 to activate an end flag EndFlg.

In a case where the bank flag BF is changed from a low level to a high level (Step S103), when the fuse scan signal FzScan is high (Step S104), the fuse data FDATA is read out from the anti-fuse set AFS (Step S105). The fuse data FDATA read out from the anti-fuse set AFS is analyzed by the available resource detector 55 (Step S106). When the corresponding anti-fuse set AFS is unused, the strobe signal RS is activated, and the current fuse address AFaddLAT is latched in the register circuit 56 (Step S107). When the corresponding anti-fuse set AFS is being used, the process returns to Step S102, and the fuse address AFaddLAT is incremented. After the fuse address AFaddLAT is latched in the register circuit 56, when the fuse scan signal FzScan is high (Step S108), the fuse scan signal FzScan is changed to a low level (Step S109), and the process returns to Step S102. At this time, increment of the fuse address AFaddLAT may be stopped in response to the end flag EndFlg, and the fuse address AFaddLAT may be reset to an initial value in response to a reset signal RST, as shown in FIG. 13. Accordingly, the fuse read operation is completed, and the unused fuse address AFaddLAT corresponding to the repair bank address SRBA is latched in the register circuit 56. In the fuse read operation, the fuse address AFaddLAT is incremented at a high speed by using the fast sequencer 20F in a period before the fuse address AFaddLAT reaches the target memory bank Bank_i+1, and therefore the fuse address AFaddLAT reaches the target memory bank Bank_i+1 in a short time. In a period in which the fuse address AFaddLAT indicates the memory bank Bank_i+1, the fuse address AFaddLAT is incremented at a low speed by using the slow sequencer 20S, and it is therefore possible to correctly read out the fuse data FDATA from the anti-fuse set AFS. Further, when the fuse address AFaddLAT exceeds the target memory bank Bank_i+1, increment of the fuse address AFaddLAT is stopped and the fuse read operation is force-quit. Therefore, the fuse read operation is completed in a short time.

When the fuse scan signal FzScan becomes low, a soft send operation as the second round starts. The basic flow of the soft send operation is the same as that of the fuse read operation, and the fuse addresses AFadd and AFaddLAT are incremented (Step S102). Also in this case, the fast sequencer 20F is selected when the speed selection signal Fst_En output from the flag generation circuit 53 is high, and the slow sequencer 20S is selected when the speed selection signal Fst_En is low. Therefore, in a period before the fuse address AFaddLAT reaches Bank_i+1, the fast sequencer 20F is selected and the fuse address AFaddLAT is incremented at a high speed, as shown in FIG. 13. When the fuse address AFaddLAT reaches Bank_i+1, the bank flag BF is changed from a low level to a high level, and the speed selection signal Fst_En is changed to a low level. The high-speed soft send operation is thus switched to the low-speed soft send operation using the slow sequencer 20S.

When the bank flag BF is changed from a low level to a high level in the soft send operation (Steps S103 and S104), the comparator 57 compares the fuse address Padd and the fuse address AFaddLAT with each other (Step S110). As a result, when both the addresses match with each other (Step S111), the multiplexer 52 supplies the repair row address SRRA to the main circuit part 60. Accordingly, the repair row address SRRA is latched in the repair-address latch circuit 67 included in the target memory bank Bank_i+1 (Step S112). When both the addresses do not match with each other, the process returns to Step S102, and the fuse address AFaddLAT is incremented. Thereafter, each of circuits related to a soft-post-package-repair operation is reset (Step S113). Accordingly, the soft send operation is completed. As described above, the fast sequencer 20F is selected in a period before the fuse address AFaddLAT reaches the target memory bank Bank_i+1 also in the soft send operation. Therefore, the fuse address AFaddLAT reaches the memory bank Bank_i+1 in a short time. In a period in which the fuse address AFaddLAT indicates the memory bank Bank_i+1, the slow sequencer 20S is selected and it is therefore possible to correctly transfer the repair row address SRRA to the repair-address latch circuit 67. Furthermore, when the fuse address AFaddLAT exceeds the target memory bank Bank_i+1, increment of the fuse address AFaddLAT is stopped and the soft send operation is force-quit. Accordingly, the soft send operation is completed in a short time.

As described above, the semiconductor memory device according to the present disclosure virtually skips various operations corresponding to memory banks other than a target memory bank by performing those operations at a high speed in a soft-post-package-repair operation. Therefore, it is possible to complete the soft-post-package-repair operation in a short time.

Figure 16:
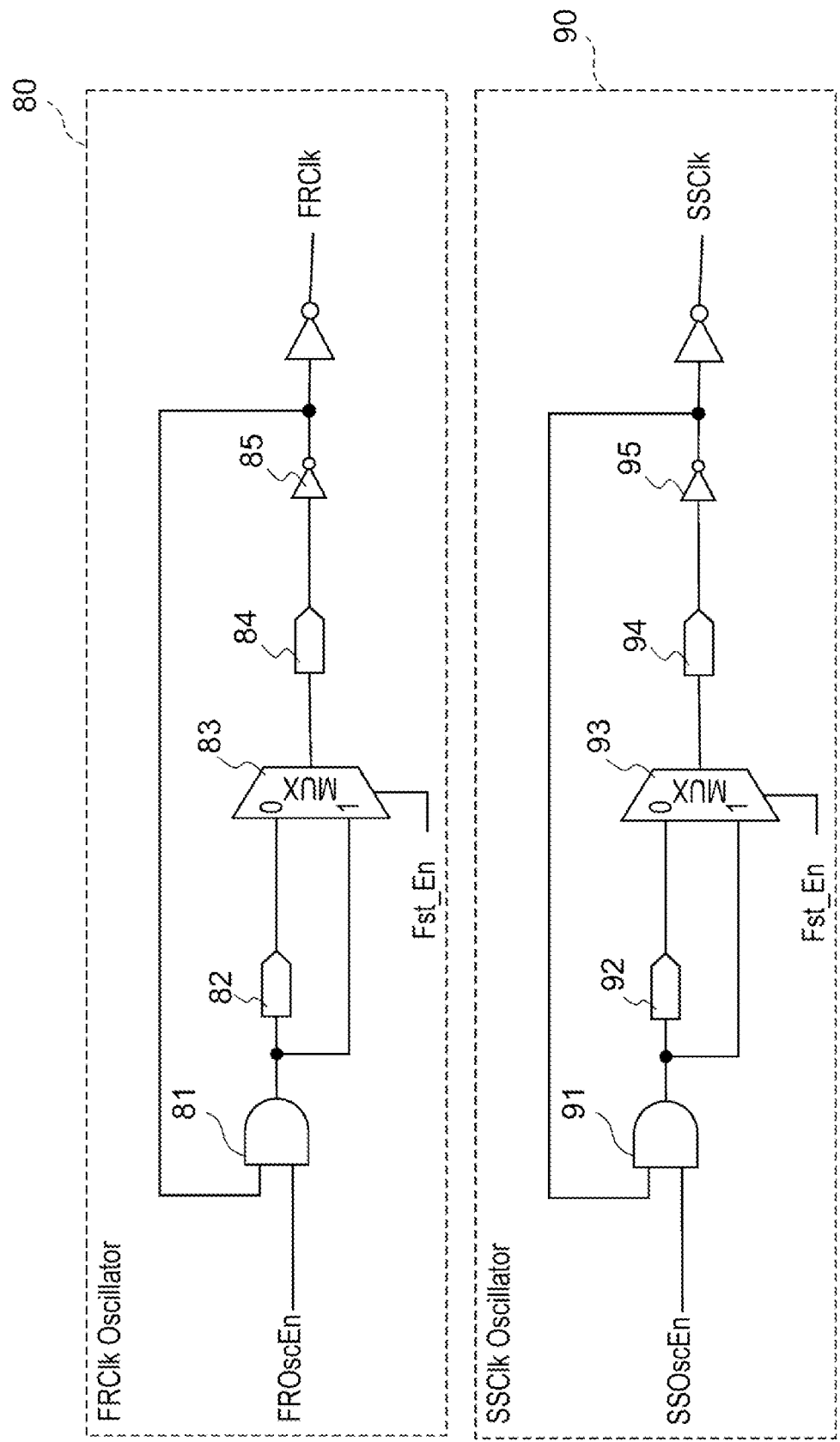
FIG. 16 is a circuit diagram of oscillator circuits according to an embodiment of the present disclosure.

FIG. 16 is a circuit diagram of oscillator circuits 80 and 90. The oscillator circuit 80 generates the clock signal FRClk, and the oscillator circuit 90 generates the clock signal SSClk. The oscillator circuit 80 has a configuration in which an AND gate circuit 81, a delay element 82, a multiplexer 83, a delay element 84, and an inverter circuit 85 are connected in circular connection and is activated in response to the enable signal FROscEn. Input nodes of the multiplexer 83 are connected to a path including the delay element 82 and a path not including the delay element 82 either of which is selected based on the speed selection signal Fst_En. In a case where the speed selection signal Fst_En is high, the path not including the delay element 82 is selected, whereby the high-speed clock signal FRClk is generated. In a case where the speed selection signal Fst_En is low, the path including the delay element 82 is selected, whereby the low-speed clock signal FRClk is generated. The oscillator circuit 90 has a configuration in which an AND gate circuit 91, a delay element 92, a multiplexer 93, a delay element 94, and an inverter circuit 95 are connected in circular connection and is activated in response to the enable signal SSOscEn. Input nodes of the multiplexer 93 are connected to a path including the delay element 92 and a path not including the delay element 92 each of which is selected based on the speed selection signal Fst_En. In a case where the speed selection signal Fst_En is high, the path not including the delay element 92 is selected, whereby the high-speed clock signal SSClk is generated. In a case where the speed selection signal Fst_En is low, the path including the delay element 92 is selected, whereby the low-speed clock signal SSClk is generated. As described above, the speed of incrementing the fuse address AFaddLAT may be changed by using the oscillator circuits 80 and 90 that can change the frequencies of the clock signals FRClkk and SSClk, respectively.

Although various embodiments have been disclosed in the context of certain preferred embodiments and examples, it will be understood by those skilled in the art that the scope of the present disclosure extends beyond the specifically disclosed embodiments to other alternative embodiments and/or uses of the embodiments and obvious modifications and equivalents thereof. In addition, other modifications which are within the scope of this disclosure will be readily apparent to those of skill in the art based on this disclosure. It is also contemplated that various combination or subcombination of the specific features and aspects of the embodiments may be made and still fall within the scope of the disclosure. It should be understood that various features and aspects of the disclosed embodiments can be combined with or substituted for one another in order to form varying modes of the disclosed embodiments. Thus, it is intended that the scope of at least some of the present disclosure should not be limited by the particular disclosed embodiments described above.

The invention claimed is:
1. An apparatus comprising:
a fuse array circuit including a plurality of fuse sets each assigned to a corresponding one of a plurality of fuse addresses and configured to operatively store a fuse data;
a first circuit configured to generate and sequentially update a fuse address to sequentially read the fuse data from the plurality of fuse sets; and
a second circuit configured to generate the first signal based on the fuse address generated by the first circuit,
wherein the first circuit is configured to change a frequency of updating the fuse address based on a first signal,
wherein the second circuit is configured to bring the first signal into a first state when the fuse address generated by the first circuit is in a first address range,
wherein the second circuit is configured to bring the first signal into a second state when the fuse address generated by the first circuit is in a second address range,
wherein the first circuit is configured to update the fuse address at a first frequency when the first signal is in the first state, and
wherein the first circuit is configured to update the fuse address at a second frequency lower than the first frequency when the first signal is in the second state.
2. The apparatus of claim 1, wherein the first circuit includes a first oscillator configured to generate a first clock signal of the first frequency and a second oscillator configured to generate a second clock signal of the second frequency.

3. The apparatus of claim 1,
wherein the first circuit includes a third oscillator configured to generate a third clock signal,
wherein the third oscillator is configured to set the third clock signal to a third frequency in order to update the fuse address in the first frequency, and
wherein the third oscillator is configured to set the third clock signal to a fourth frequency lower than the third frequency in order to update the fuse address in the second frequency.

4. The apparatus of claim 1, wherein the second circuit is configured to, when a second signal is in a third state, latch the fuse address supplied from the first circuit when the fuse data output from the fuse array circuit indicates that the fuse set is available.

5. The apparatus of claim 4, wherein the second circuit is configured to, when the second signal is in a fourth state, output a repair address supplied from outside instead of the fuse data output from the fuse array circuit when the fuse address supplied from the first circuit matches with the fuse address latched in the second circuit.

6. The apparatus of claim 5, wherein the first and second circuits are configured to be activated responsive to a soft-post-package-repair command.

7. The apparatus of claim 6, further comprising a third circuit configured to store a plurality of the fuse data transferred from the fuse array circuit,
wherein the third circuit is configured to store the repair address output from the second circuit during a soft-post-package-repair operation.

8. The apparatus of claim 1, wherein each of the fuse sets includes a plurality of anti-fuse elements.

9. An apparatus comprising:
a fuse array circuit including a plurality of groups assigned to the fuse bank address, each of the groups including a plurality of fuse sets;
a command decoder configured to receive a soft-post-package-repair command and a soft-post-package-repair address including a bank address and a row address; and
a first circuit configured to sequentially select the plurality of fuse sets to read a fuse data stored therein responsive to the soft-post-package-repair command,
wherein the first circuit is configured to sequentially select the plurality of fuse sets in a first frequency when the fuse bank address assigned to the fuse set currently selected does not match with the bank address, and
wherein the first circuit is configured to sequentially select the plurality of fuse sets in a second frequency lower than the first frequency when the fuse bank address assigned to the fuse set currently selected matches with the bank address.

10. The apparatus of claim 9, further comprising a second circuit including an available resource detector and a register circuit,
wherein the available resource detector is configured to activate a strobe signal when the fuse data output from the fuse array circuit indicates that the fuse set currently selected is available while the fuse bank address assigned to the fuse set currently selected matches with the bank address, and
wherein the register circuit is configured to latch a fuse address of the fuse set currently selected responsive to the strobe signal.

11. The apparatus of claim 10, wherein the second circuit further includes a multiplexer configured to output the row address instead of the fuse data output from the fuse array circuit when the fuse address of the fuse set currently selected matches with the fuse address latched in the register circuit.

12. The apparatus of claim 11,
wherein the first circuit is configured to sequentially select the plurality of fuse sets twice including first and second rounds responsive to the soft-post-package-repair command,
wherein the available resource detector is configured to be activated in the first round, and
wherein the multiplexer is configured to be activated in the second round.

13. The apparatus of claim 12, further comprising a third circuit configured to store a plurality of the fuse data transferred from the fuse array circuit,
wherein the third circuit is configured to store the row address output from the second circuit during a soft-post-package-repair operation.

14. The apparatus of claim 9, wherein each of the fuse sets includes a plurality of anti-fuse elements.

15. An apparatus comprising:
a fuse array circuit including a plurality of fuse sets each assigned to a fuse address and configured to store a fuse data; and
a first circuit configured to sequentially update the fuse address to read the fuse data from the plurality of fuse sets,
wherein the first circuit is configured update the fuse address in a first frequency before the fuse address reaches a first value, and update the fuse address in a second frequency lower than the first frequency after the fuse address reaches the first value.

16. The apparatus of claim 15, wherein the first circuit is configured stop updating the fuse address after the fuse address reaches a second value different from a maximum value.

17. The apparatus of claim 15, wherein the first circuit is configured to be activated responsive to a soft-post-package-repair command.

* * * * *